United States Patent
Barsun et al.

(10) Patent No.: US 7,385,824 B2
(45) Date of Patent: Jun. 10, 2008

(54) PROCESSOR MODULE WITH RIGIDLY COUPLED PROCESSOR AND VOLTAGE-REGULATOR HEAT SINKS

(75) Inventors: Stephan K. Barsun, Sacranento, CA (US); Brent Allen Boudreaux, Highland Village, TX (US); Brandon Rubenstein, Loveland, CO (US); Stephen Daniel Cromwell, Penryn, CA (US); Eric C. Peterson, McKinney, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 158 days.

(21) Appl. No.: 11/192,736

(22) Filed: Jul. 29, 2005

(65) Prior Publication Data

US 2007/0025088 A1 Feb. 1, 2007

(51) Int. Cl.
*H05K 7/20* (2006.01)
(52) U.S. Cl. .............. 361/719; 361/707; 361/709; 361/717; 361/718; 257/707
(58) Field of Classification Search ............. 361/683, 361/700, 704, 714, 715, 719, 728, 731, 732, 361/752, 785, 788, 707, 709, 717, 718; 165/80.2, 165/80.3, 80.4, 104.14, 104.21, 104.32, 104.33, 165/104.34, 185; 257/706–727; 363/53, 363/147; 439/67
See application file for complete search history.

(56) References Cited

U.S. PATENT DOCUMENTS

| | | | |
|---|---|---|---|
| 5,734,555 A * | 3/1998 | McMahon | 361/704 |
| 6,285,550 B1 * | 9/2001 | Belady | 361/704 |
| 6,392,899 B1 * | 5/2002 | Harrison et al. | 361/803 |
| 6,594,556 B1 * | 7/2003 | Agatstein et al. | 700/298 |
| 6,845,013 B2 * | 1/2005 | Hartke et al. | 361/704 |
| 7,154,754 B2 * | 12/2006 | Barsun et al. | 361/715 |
| 2003/0120958 A1 | 6/2003 | Zhang | |
| 2003/0122429 A1 | 7/2003 | Zhang et al. | |
| 2003/0126477 A1 | 7/2003 | Zhang | |
| 2003/0181075 A1 * | 9/2003 | Hartke et al. | 439/67 |
| 2003/0187630 A1 | 10/2003 | Zhang | |
| 2005/0177299 A1 * | 8/2005 | Koerner et al. | 701/103 |
| 2005/0207131 A1 * | 9/2005 | Prokofiev et al. | 361/760 |

\* cited by examiner

*Primary Examiner*—Lisa Lea-Edmonds
*Assistant Examiner*—Anthony M Haughton

(57) ABSTRACT

A processor module includes a processor and a voltage regulator both mounted on a carrier. The voltage regulator is mounted with its contacts under compression to ensure good electrical contact with pads on the carrier. Heat sinks mounted respectively on the processor and the voltage regulator are rigidly coupled to each other to provide rigidity to the module and thus maintain the desired compression of the voltage regulator contacts.

12 Claims, 4 Drawing Sheets

PROCESSOR MODULE WITH RIGIDLY COUPLED PROCESSOR AND VOLTAGE-REGULATOR HEAT SINKS

BACKGROUND OF THE INVENTION

The present invention relates to computers and, more particularly, to a processor module that includes a voltage regulator. In this specification, related art labeled "prior art" is admitted prior art; related art not labeled "prior art" is not admitted prior art.

Computer processors are using lower voltages to achieve faster switching times (and thus higher performance) while minimizing power consumption and associated problems with heat dissipation. As the voltage differential between logic high and logic low is reduced, voltage levels must be more precisely controlled to avoid errors and maintain functionality.

SUMMARY OF THE INVENTION

The present invention provides a processor module with a processor and a voltage regulator mounted on a carrier. The voltage regulator has flexible contacts that contact pads on the carrier under compression. Heat sinks are provided for both the processor and the voltage regulator. Means are provided for rigidly coupling the heat sinks so that the aforementioned compression is fixed.

BRIEF DESCRIPTION OF THE DRAWINGS

The drawings are of embodiment(s)/implementation(s)s of the invention and not of the invention itself.

DETAILED DESCRIPTION

Figure 1:
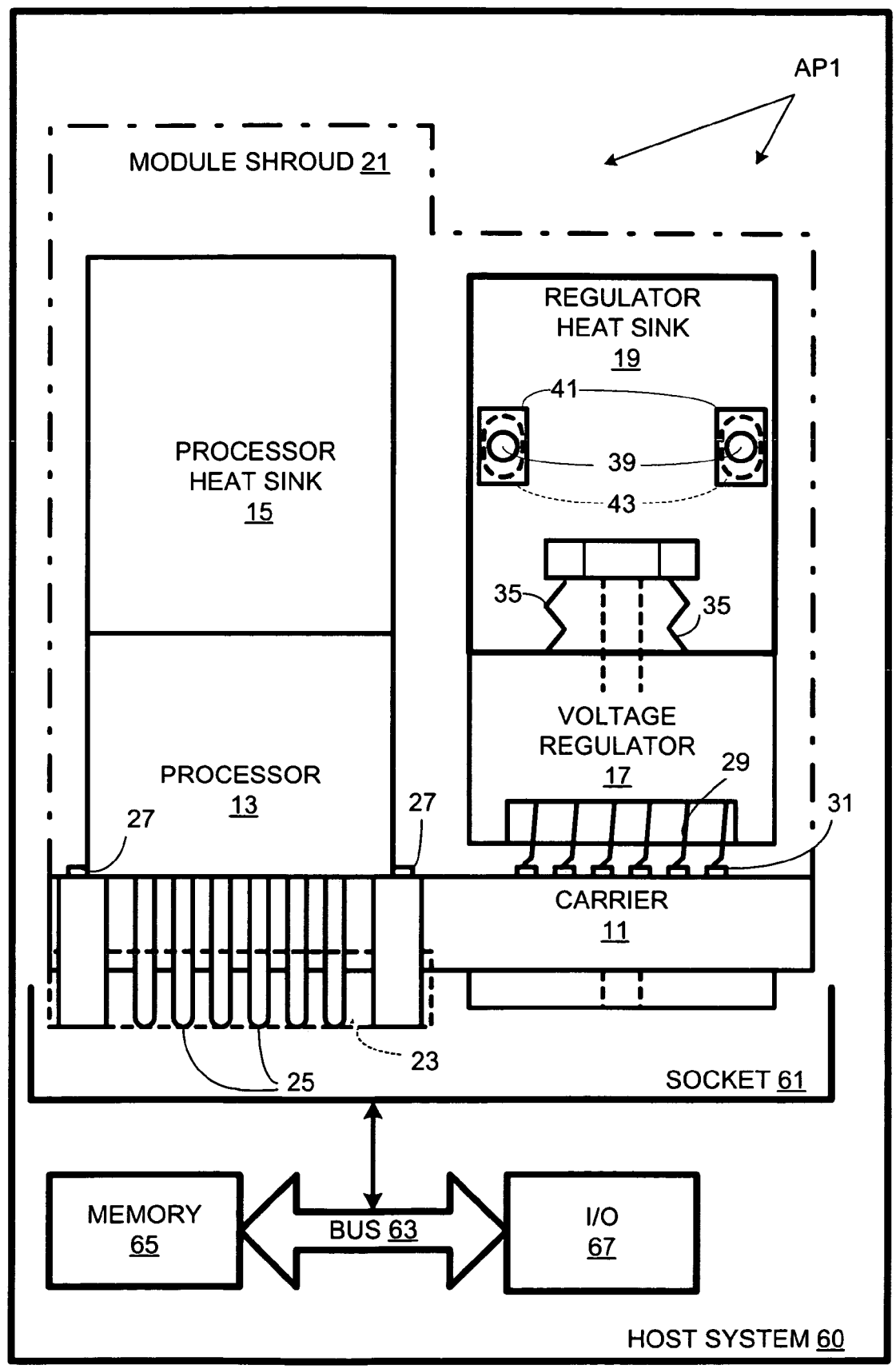
FIG. 1 is a schematic diagram of one of many possible processor modules provided by the invention.

Of the many possible processor modules provided by the present invention, highly schematic FIG. 1 shows a processor module AP1 having a daughterboard carrier 11, a processor 13, a processor heat sink 15, a discrete (i.e., separate from the processor) voltage regulator 17, a voltage regulator heat sink 19, a module shroud 21, and a pin shroud 23. Processor 13 is mounted on carrier 11 so that processor pins 25 extend through and beyond carrier 11 so that they can mate with a socket on a motherboard of a host computer. Pin shroud 23, attached to carrier 11 by screws 27, protects processor pins 25 and assists alignment of processor heat sink 15 during assembly.

Voltage regulator 17 includes an array of cantilevered conductive leads 29 that contact a corresponding array of pads 31 on carrier 11. It is through these pads 31 that voltage regulator 17 provides the voltages required by processor 13. Voltage regulator 17 is attached to carrier 11 by two screws 33 torqued to compress a leaf spring 35, shown in the exploded pre-assembly drawing of FIG. 2. This puts leads 29 under compression to ensure good electrical contact with pads 31. Leads 29 are flexible to accommodate manufacturing tolerances associated with the voltage regulator 17 and also with the pads 31 on carrier 11.

Figure 3:
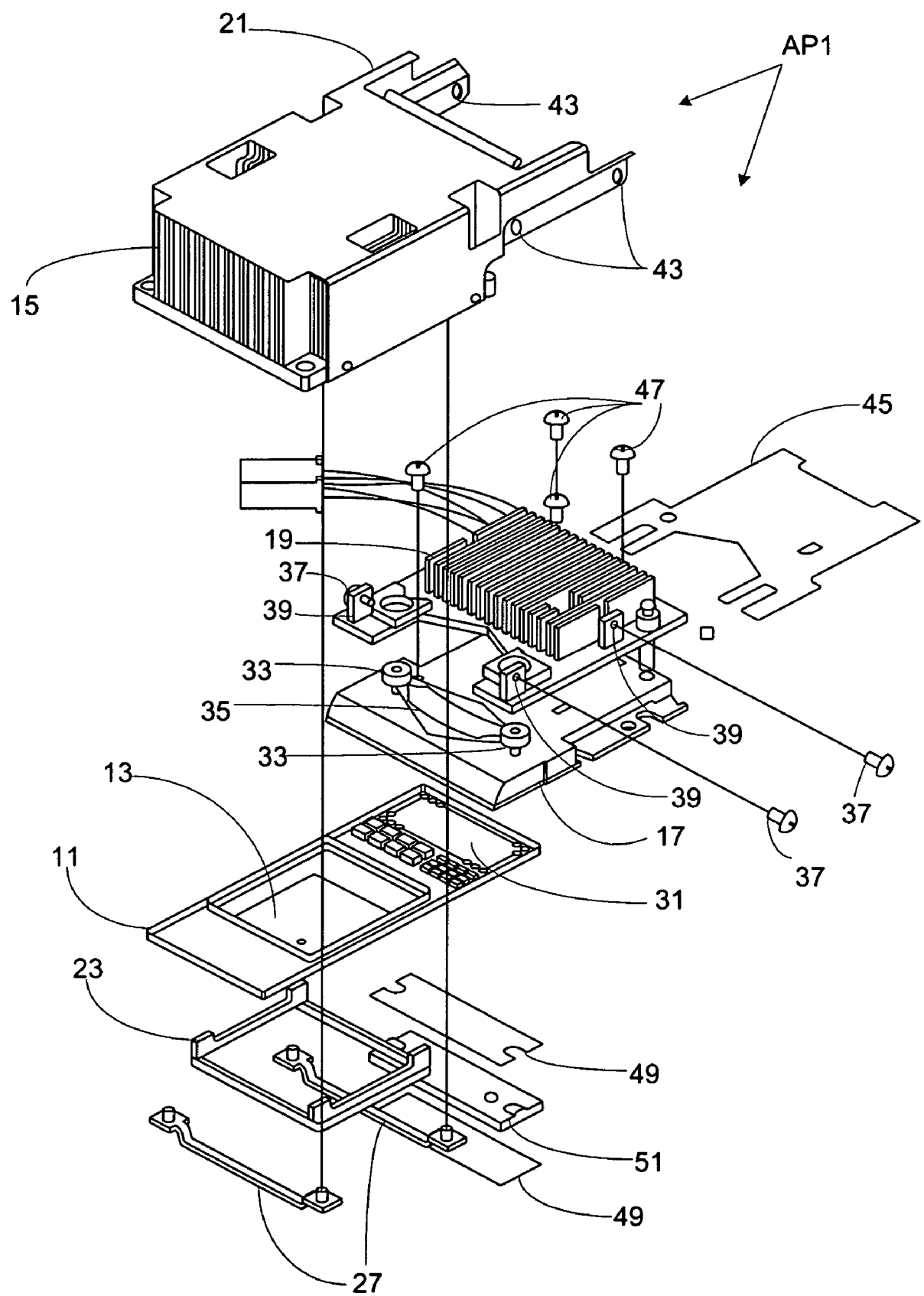
FIG. 3 is a perspective view of the module of FIG. 1.

Processor heat sink 15 is mounted on processor 13, and regulator heat sink 19 is mounted on voltage regulator 17. Module shroud 21 is attached to both heat sinks 15 and 19 so that they are rigidly coupled. Shroud 21 is attached to regulator heat sink 19 by four screws 37, one shown in FIG. 3, that engage threaded holes 39 (two shown in FIG. 1) in tabs 41 of regulator heat sink 19. Threaded holes 39 have generally circular cross sections. Screws 37 extend through oblong holes 43 in shroud 21. Oblong holes 43 are elongated in the direction in which leaf spring 35 spaces voltage regulator 17 from carrier 11. Oblong holes 43 thus accommodate the spacing set leaf spring 35 and screws 37; securing the screws 37 effectively locks the spacing.

Module shroud 21 rigidly couples heat sinks 15 and 19 when screws 37 are attached. The vertical sidewalls of shroud 21 resist vertical flexing that otherwise might be permitted by carrier 11. This limits movement of leads 29 relative to pads 31. Thus vulnerability to missed contacts at pads 31 and wear due to frictional motion of the leads 29 against pads 31 are reduced relative to what they would be without the rigid coupling effected by shroud 21.

Processor module AP1 is represented in FIG. 1 installed in a host computer system 60 via a socket 61. Socket 61 couples processor module AP1 to a bus 63 and thus to memory 65 and I/O devices 67.

Figure 2:
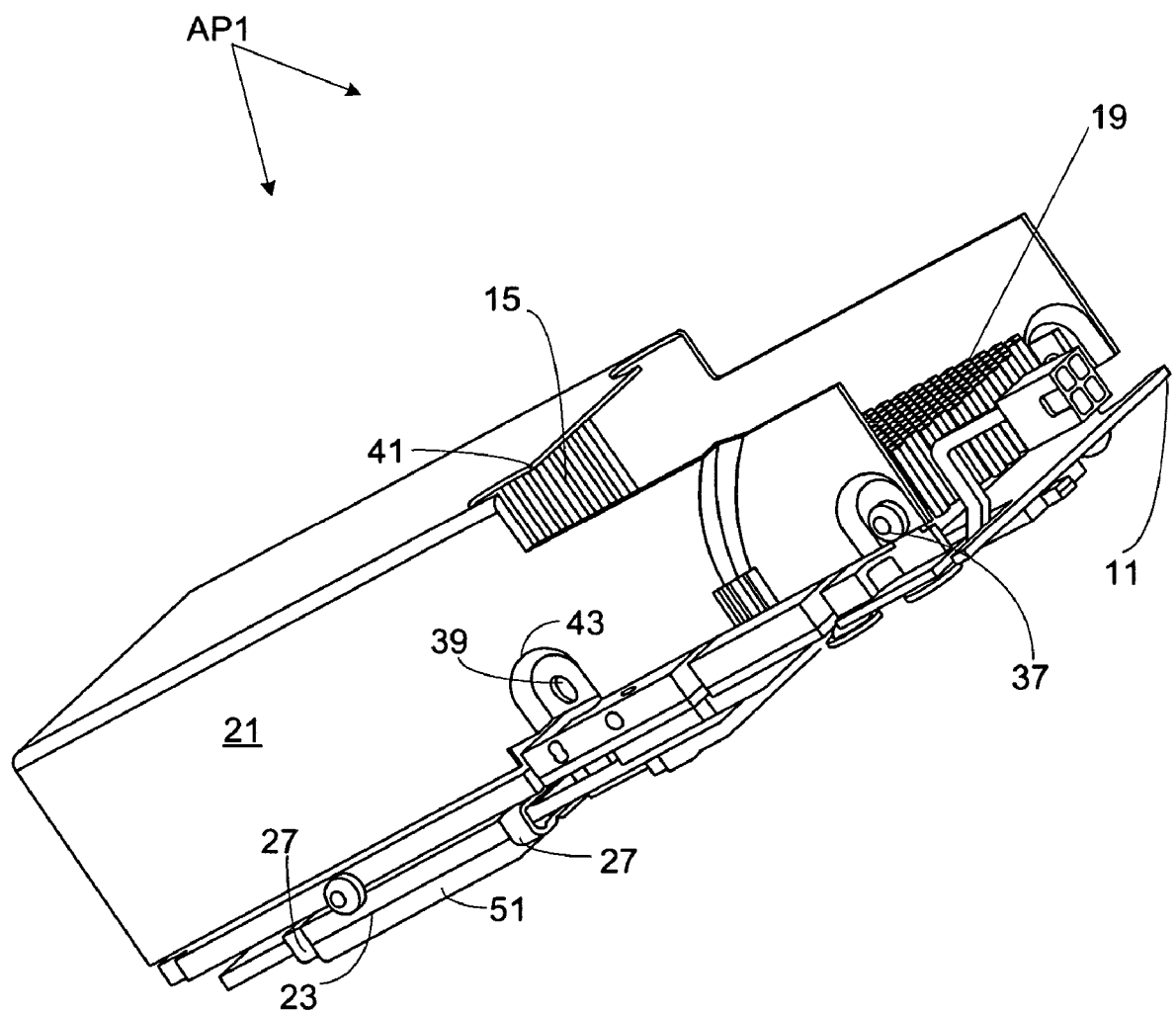
FIG. 2 is an exploded view of the module of FIG. 1.
Figure 4:
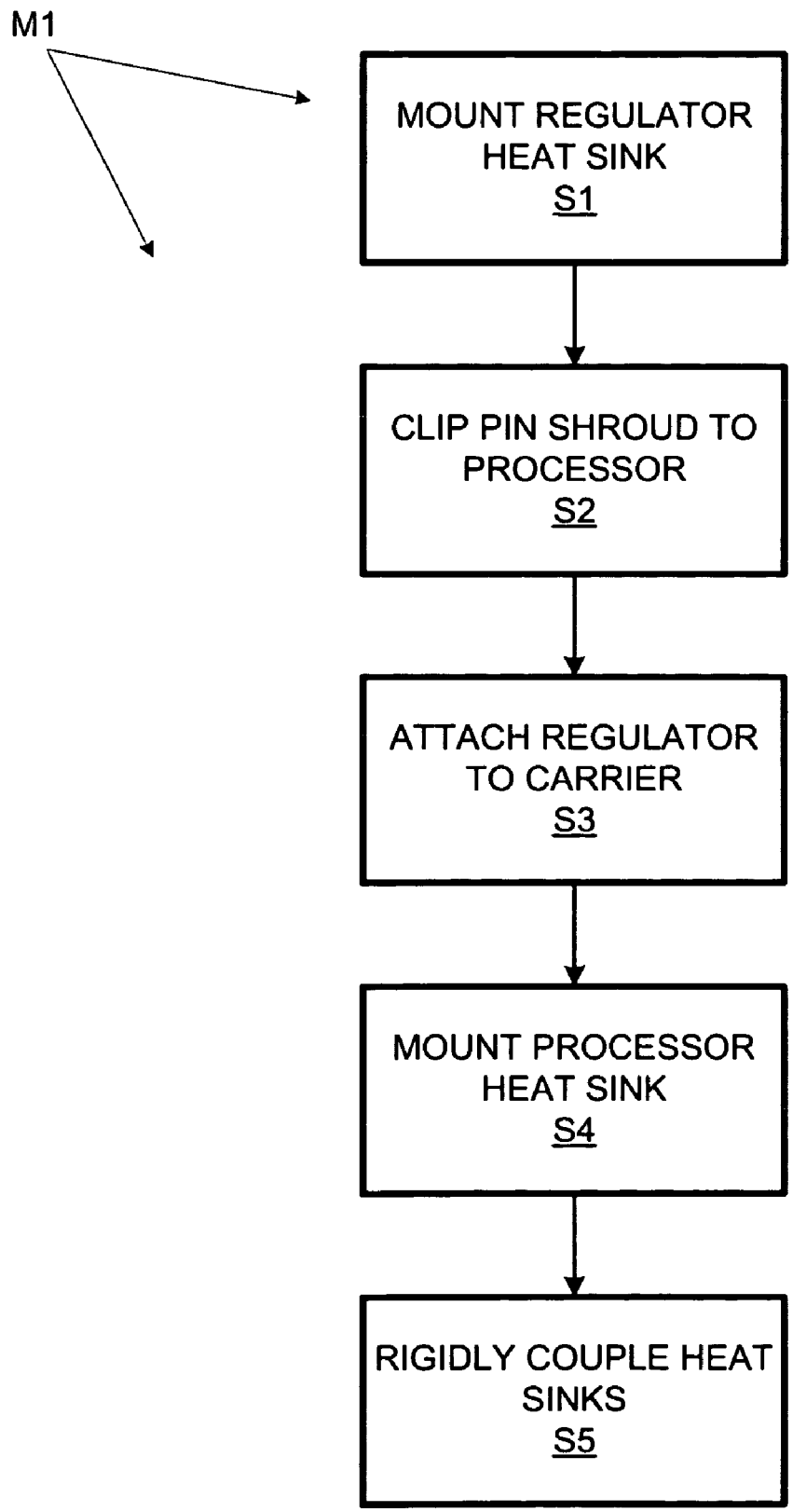
FIG. 4 is a flow chart of one of many methods within the scope of the invention for assembling the module of FIG. 1.

A method M1 of assembling module AP1 is flow charted in FIG. 4 and described with further reference to an exploded view of FIG. 2. Some assembly has already been completed: processor 13 is mounted on carrier 11 and module shroud 21 is attached to processor heat sink 15.

At process segment S1, "regulator" heat sink 19 is mounted on voltage regulator 17. This can involve sandwiching phase-change thermal insulating material 45 between voltage regular 17 and heat sink 19. Then heat sink 19 is attached to voltage regulator 17 by four vertically extending screws 47. At process segment S2, pin shroud 23 is clipped to processor 13.

At process segment S3, regulator 17 is attached to carrier 11. To this end, insulators 49 are attached to a bolster plate 51. Screws 37 are then inserted through holes in leaf spring 35, voltage regulator 37, to engage threaded holes in bolster plate 51.

At process segment S4, heat sink 15 is mounted on processor 13. To this end, thermal grease is applied to the processor lid. Then, processor heat sink 15 with module shroud 21 attached is placed onto the regulator heat sink 19 and processor 13 so that it fits between four slotted tabs 41 on regulator heat sink 19. Preferably alignment pins around processor 13 fit into the processor heat sink surface. Then spring clips 27 are placed onto the processor 13 and are torqued in place to attached carrier 11 and processor heat sink.

At process segment S5, heat sinks 15 and 19 are rigidly coupled via a mechanical path excluding processor 13 and carrier 11. To this end four screws 37 are placed in slotted tabs 41 of heat sink 19 and torqued so as to ensure that the processor lid stays in flat contact with heat sink 15. The resulting module AP1 is shown in perspective in FIG. 3.

The disclosed method is preferable to one in which the voltage regulator and processor are hard mounted to a daughterboard, since that process could induce a tolerance height mismatch. The disclosed method is also preferable to an approach in which the processor and voltage regulator are separately mounted on the motherboard, as the latter method involves a potentially fragile "floating" hardware connection to the power pod to allow the leaf springs to compensate for height tolerances.

The invention is particularly applicable to processors that require a variety of voltage levels, including low voltage levels, at its inputs. Generally, a wide range of processors and voltage regulators can be incorporated by the present invention. Also, the heat sinks can be rigidly coupled in a variety of ways. A variety of shroud configurations can be used. In some embodiments, the heat sinks are bolted to each other so that a shroud is not necessary. In other embodiments, a component other than a shroud is used to mechanically couple the heat sinks. The invention also permits carriers for a processor and heat sink other than daughter boards. In addition, more than one processor and more than one voltage regulator can be mounted on a single carrier.

While the invention has particular applicability for low-voltage processors, it applies to processors regardless of their voltage requirements. While the invention was developed with 64-bit processors in mind, it can be applied as well to processors with greater or lesser word lengths. The invention provides for single processor systems as well as multiprocessor systems. Both single-core and multi-core processors are provided for.

The invention provides for modules with more than one processor and for modules with more than one voltage regulator. For example, a single voltage regulator can serve two processors, with all three devices being mounted on a common daughterboard. In alternative embodiments, two or more regulators can use coupled to a single processor—e.g., for redundancy in a high-availability computer. Similarly, two voltage regulators can be used on a module with two processors with each voltage regulator supplying power to both processors, again for redundancy. The processors can be nominally identical or serve distinct functions, such as a general-purpose processor with an associated external floating-point or graphics processor.

The rigid coupling can be provided by a shroud as in the illustrated embodiment. Alternatively, a single heat sink can be used for both the processor and the voltage regulator. Alternatively, separate heat sinks can be welded together. Another possibility is to use a mechanism other than the shroud to provide the rigid coupling.

While the illustrated embodiment uses a leaf spring to provide the initial spacing between the voltage regulator and the carrier, alternative means can be used for this function. In alternative embodiments, the mechanism for setting the spacing is not built into the module; instead a jig or other external device can provide the spacing; the external device can be separated once the desired spacing is "locked".

In the illustrated computer system, a single bus is shown; in practice, several buses or a network fabric can be employed. For example, a specialized bus can be used for coupling the processor to some component for maximum performance; examples of such components can include external cache memory and graphics processors. The memory can include solid-state and disk memory, including one or more hard disks. The solid-state memory can include both volatile and non-volatile memory. The I/O devices can include interfaces for a keyboard, for a mouse or other pointing device, a modem, a network, external disks, etc. The illustrated computer system is a server and lacks a display. However, it can include an interface for a display. The invention also applies to workstations, laptops, and other forms of computers.

The illustrated heat sinks are metal and include many heat-radiating elements. The incorporating computer system can include one or more fans to circulate the air bearing the radiated heat so sustain cooling efficiency. Alternatively or in addition, the computer can employ a heat pump design for circulation. Alternative heat sinks can include channels for circulating fluid for heat removal. Thermally conductive adhesive can be used to ensure effective heat conduction between a processor or voltage regulator and its heat sink.

The present invention applies in the context of a processor module that includes a processor and a separate voltage regulator. Having a voltage regulator in close proximity with a processor helps ensure precise control of the voltages actually received by the processor. In the course of the present invention, it was determined that, in some cases, the module was undesirably flexible.

In certain embodiments of the invention, the entire module is more rigid so there is less play in some electrical contacts. The module is tolerant of handling and mounting so that modules can be exchanged with little risk of impairment or damage to the module. Also, the module can be mounted on a motherboard in one operation, rather than requiring separate mounting steps for the processor and voltage regulator. Further, as the spacing between a carrier, e.g., daughterboard, and the power voltage regulator is locked at an optimal level, there is less chance that the spacing will become less optimal after mounting on the motherboard.

In the illustrated embodiment, the incorporating computer system includes one processor module. In alternative computer systems, multiple such modules are incorporated. These modules can be nominally identical, or they can include different processors, different voltage regulators, or both. These and other modification to and variations upon the illustrated embodiment are provided for by the present invention, the scope of which is defined by the following claims.

What is claimed is:

1. A processor module comprising:
   a carrier having pads;
   a processor rigidly mounted to said carrier;
   a voltage regulator with flexible contacts, said voltage regulator being mounted on said carrier so that said flexible contacts contact said pads under compression, said carrier providing for electrical connectivity between said flexible contacts and said processor;
   means for adjusting said compression;
   heat sinks respectively mounted on said processor and said voltage regulator; and
   means for rigidly coupling said heat sinks so that said compression is fixed.

2. A processor module as recited in claim 1 wherein said means for rigidly coupling is a shroud.

3. A processor module as recited in claim 2 wherein said shroud surrounds said heat sinks.

4. A processor module as recited in claim 1 wherein said flexible contacts are cantilevered conductive leads.

5. A method of assembling a processor module comprising:
   attaching said voltage regulator to a carrier to which said processor is attached so that electrical contacts between said voltage regulator and said carrier are compressed;
   adjusting a degree to which said electrical contacts are compressed; and
   rigidly coupling a first heat sink attached to a processor and a second heat sink attached to a voltage regulator for providing predetermined voltages to said processor, said coupling involving attaching a shroud to said heat sinks.

6. A method as recited in claim 5 wherein said coupling is achieved through a mechanical path excluding said processor and said voltage regulator.

7. A method as recited in claim 5 wherein said electrical contacts are cantilevered flexible conductive leads.

8. A computer system comprising:
memory;
I/O devices;
a processor module including
- a carrier having pads,
- a processor rigidly mounted to said carrier,
- a voltage regulator with flexible contacts, said voltage regulator being mounted on said carrier so that said flexible contacts contact said pads under compression, said carrier providing for electrical connectivity between said flexible contacts and said processor,
- heat sinks respectively mounted on said processor and said voltage regulator, and
- means for rigidly coupling said heat sinks so that said compression is fixed; and means for providing communication among said memory, said I/O devices, and said processor module; and means for adjusting said compression.

9. A computer system as recited in claim 8 wherein said means for rigidly coupling is a shroud.

10. A computer system as recited in claim 9 wherein said shroud surrounds said heat sinks.

11. A computer system as recited in claim 8 further comprising a socket for engaging said processor module.

12. A computer system as recited in claim 8 wherein said flexible contacts are cantilevered conductive leads.

* * * * *